(12) United States Patent
Kaneko

(10) Patent No.: US 7,416,103 B2
(45) Date of Patent: *Aug. 26, 2008

(54) FLOW SOLDERING APPARATUS

(75) Inventor: Toru Kaneko, Fukuroi (JP)

(73) Assignee: Minebea Co., Ltd., Magano (JP)

( * ) Notice: Subject to any disclaimer, the term of this patent is extended or adjusted under 35 U.S.C. 154(b) by 423 days.

This patent is subject to a terminal disclaimer.

(21) Appl. No.: 10/542,626

(22) PCT Filed: Oct. 29, 2003

(86) PCT No.: PCT/JP03/13834

§ 371 (c)(1),
(2), (4) Date: Aug. 24, 2005

(87) PCT Pub. No.: WO2004/076114

PCT Pub. Date: Sep. 10, 2004

(65) Prior Publication Data

US 2006/0191976 A1    Aug. 31, 2006

(30) Foreign Application Priority Data

Feb. 26, 2003    (JP)    ................................ 2003-049353

(51) Int. Cl.
*B23K 3/06*    (2006.01)
(52) U.S. Cl. .......................... 228/37; 228/36; 210/767; 210/799; 68/208
(58) Field of Classification Search ............. 228/111.5, 228/37; 68/208; D23/261; 210/767, 799
See application file for complete search history.

(56) References Cited

U.S. PATENT DOCUMENTS

| | | | |
|---|---|---|---|
| 5,156,324 A | 10/1992 | Hueste et al. | |
| 5,379,931 A * | 1/1995 | Van Schaik | 228/37 |
| 5,769,305 A | 6/1998 | Takeda et al. | |

FOREIGN PATENT DOCUMENTS

| | | |
|---|---|---|
| JP | A 05-305432 | 11/1993 |
| JP | A 09-47866 | 2/1997 |

* cited by examiner

*Primary Examiner*—Jerry Lorengo
*Assistant Examiner*—Erin P Barry
(74) *Attorney, Agent, or Firm*—Oliff & Berridge, PLC

(57) ABSTRACT

A compact soldering apparatus capable of increasing reliability of products by reducing occurrence of dross and using lead-free solder, wherein a primary jet nozzle 1, a secondary jet nozzle 2, and a pump (not shown) forming jet waves 24, 25 are installed in a solder tank 6 reservoiring molten solder S. Guide plates 4, 5 are installed between the jet nozzles 1, 2 above a solder face F of the molten solder S on a position where the molten solder is dropped. The guide plates 4, 5 formed into a V-shape are provided with solder guide portions crossing each other so as to drop the molten solder S at different positions on the solder face F of the solder tank 6. Molten solder dropped onto upper portions of the guide plates 4, 5 passes through the solder guide portions and is made to fall on a nozzle side different to a nozzle side where the solder is flowed.

13 Claims, 7 Drawing Sheets

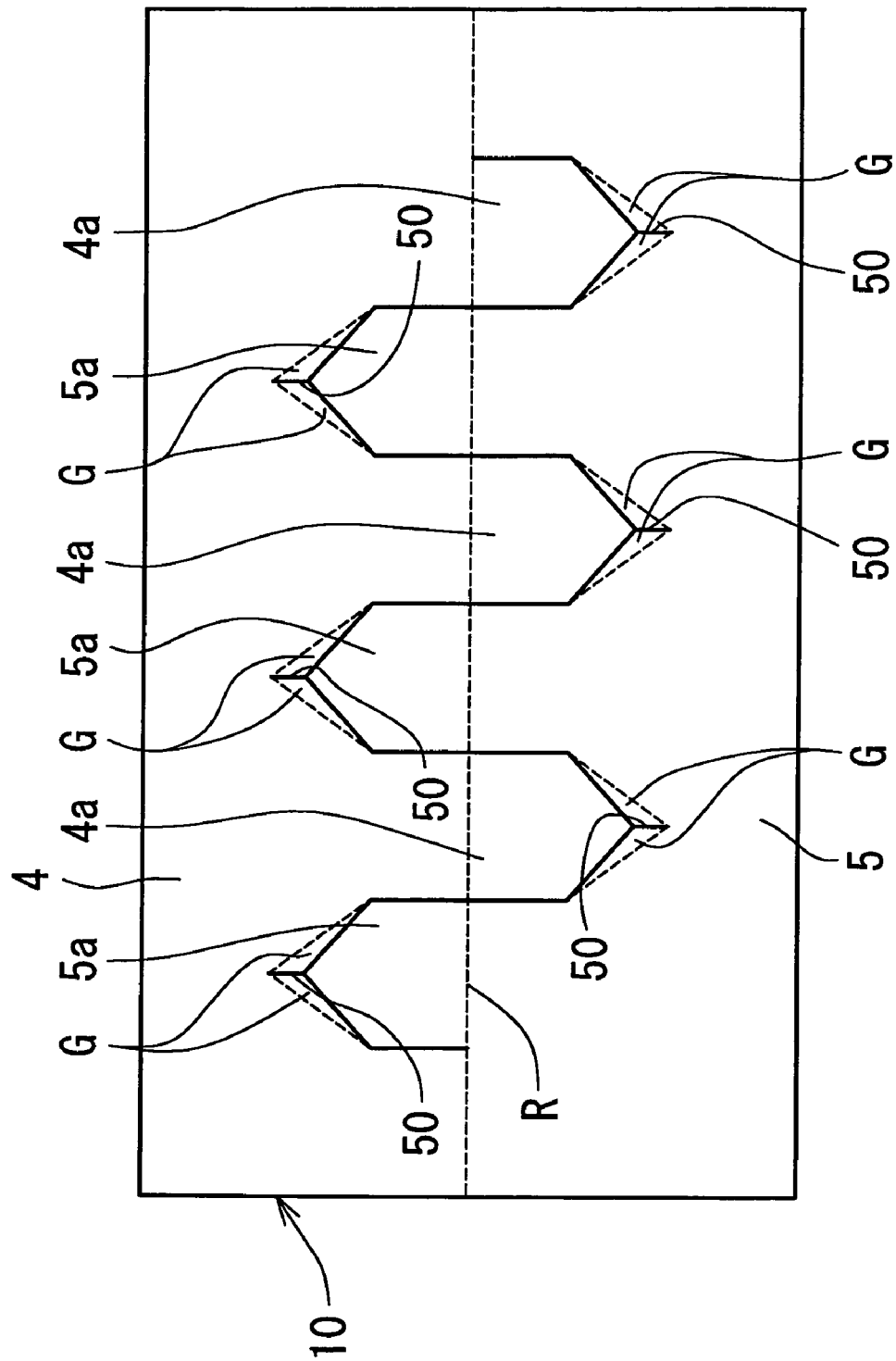

FLOW SOLDERING APPARATUS

TECHNICAL FIELD

The present invention relates to a soldering apparatus, and more specifically to a flow soldering apparatus suitable for miniaturization of the soldering apparatus.

BACKGROUND ART

One of the flow soldering apparatuses performs soldering in that a printed circuit board is first soldered with a primary jet nozzle, and then a secondary jet nozzle adjusts soldering defects such as bridges, icicles, etc. caused through the soldering procedure of the primary jet nozzle (refer to, for example, Japanese Patent Application Laid-Open No. H9-8450). In this type of the flow soldering apparatus, a surface of solder has been oxidized which then produces impurities called dross. As a countermeasure thereto, a surface of a solder layer may be filled with inert gas (refer to, for example, Japanese Patent Application Laid-Open No. H9-47866), or the surface of the solder may be covered with anti-oxidizing oil such as vegetable oil. However, the former incurs increase in cost for using of the gas, which disadvantages a low-cost feature given to the flow soldering. On the other hand, the latter involves a problem of that stink or foreign matters occur due to thermal decomposition of the oil. The flow soldering apparatus may be provided with a dispersion protective-shield for foreign matters, which covers an upper portion where molten solder flowed and dropped from the nozzle strongly collides against a solder surface in a solder tank or flow from another nozzle (refer to, for example, Japanese Patent Application Laid-Open No. 5-305432).

Referring to FIG. 9, the molten solder both flowed from the primary jet nozzle and the secondary jet nozzle in the solder tank is moved downward and met each other between the jet nozzles. The dross tends to build up at the merging point D. Once the dross occurs, it spreads as covering the surface of the solder, and the dross eventually spreads upward over the surface flowed from the primary jet nozzle and the secondary jet nozzle. In order to prevent the upward spread of the dross, the interval between the solder flowed from the primary jet nozzle and the secondary jet nozzle is generally kept at 5 cm or more.

However, the foregoing flow soldering apparatuses have had the following drawbacks. Because the dross spreads upward over the flowed surface of the primary jet nozzle and the secondary jet nozzle, the dross attaches to the solder surface of the circuit board which causes soldering defects such as bridges, icicles, etc. Considering cost and productivity, the above soldering manner may be appropriate for home-use electrical products but cannot be applied to fine-pitch electronic components since the bridges cannot be eliminated completely. For the circuit board with the fine-pitch electronic components which is soldered in the conventional solder tank, operators need to perform visual inspection to solder portions after the circuit board is soldered. In case the bridges are detected, the operators are required to repair the circuit board with an iron, which hampers productivity.

Further, because the interval between the solder flowed from the primary jet nozzle and the secondary jet nozzle has approximately 5 cm, the solder attached to the circuit board cools down while the circuit board moves between the jet nozzles, whereby the performance of the soldering at the secondary jet nozzle becomes deteriorated. Also, for being incapable to reduce the interval between the nozzles, the above-mentioned flow soldering apparatuses have difficulties to be miniaturized.

Furthermore, in case the conveying speed of the circuit board between the primary jet nozzle and the secondary jet nozzle is made faster for not having the solder attached to the circuit board cooled, time in which the circuit board faces these jet nozzles gets shorter, whereby temperature of the solder on the circuit board surface is restrained from rising, causing soldering failure, or defects such as bridges, icicles, etc.

Still further, although a lead-free solder has been used in recent years for an environmental protection, the lead-free solder has a high-melting point (approximately 230° C.) compared to a conventional solder (approximately 183° C.). The lead-free solder is thus more affected by the temperature drop-down on the circuit board than the conventional solder. Accordingly, in order to use the lead-free solder, the interval between the primary jet nozzle and the secondary jet nozzle needs to be further reduced for preventing the solder from dropping-down of the temperature.

The present invention has been made in light of the above problem, and it is an object of the present invention to provide a compact soldering apparatus applicable for a lead-free solder while reducing an occurrence of dross to improve product reliability.

DISCLOSURE OF INVENTION

In a flow soldering apparatus of the present invention recited in claim 1, for achieving the above object, at position where molten solder flowed from a primary jet nozzle and a secondary jet nozzle in a solder tank is dropped, a V-shaped guide plate provided with solder guide portions is placed, so that the molten solder flowed from the primary jet nozzle and the secondary jet nozzle is dropped on a nozzle side different to a nozzle side where the solder is flowed.

In a flow soldering apparatus recited in claim 2, the guide plate is made of a material to which solder is not attached.

In a flow soldering apparatus recited in claim 3, the guide plate is provided with stripe-shaped solder guide portions alternately configured in the direction of a ridge line of a plate bent into a V-shape.

In a flow soldering apparatus recited in claim 4, a solder separator is provided between the stripe-shaped solder guide portions formed on the guide plate.

In a flow soldering apparatus recited in claim 5, the guide plate is formed by placing two pieces of plates into a V-shape and has a space along a ridge line of the V-shaped guide plate.

In a flow soldering apparatus recited in claim 6, the guide plate is formed in such a manner that some of the independent solder guide portions are alternately provided in the direction of the ridge line.

In a flow soldering apparatus recited in claim 7, an intersection point or an extended intersection point of the V-shaped guide plate is placed above the molten solder.

BRIEF DESCRIPTION OF DRAWINGS

FIG. 4 is a development view of the guide plate;

BEST MODE FOR CARRYING OUT THE INVENTION

Figure 1:
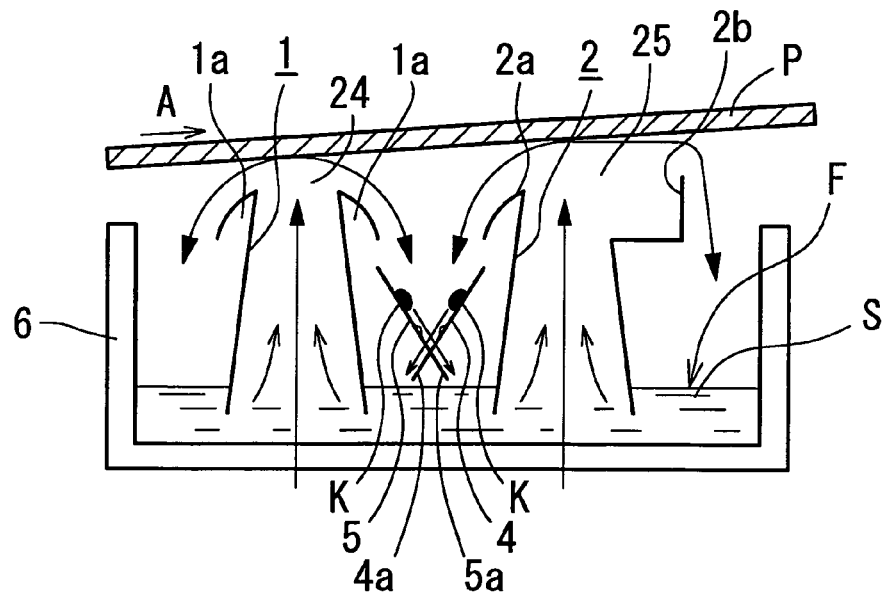
FIG. 1 is a drawing showing performance of a flow soldering apparatus according to the present invention.

One embodiment of the present invention will be described hereinafter with reference to FIG. 1. In FIG. 1 a solder tank 6 reservoiring molten solder S comprises a primary jet nozzle 1, a secondary jet nozzle 2 and a pump (not shown) forming jet waves 24, 25. Guide plates 4, 5 placed between the jet nozzles 1, 2 are provided at a position above a solder face F of the molten solder S. The guide plates 4, 5 are provided at a position where the molten solder flowed from both the primary jet nozzle 1 and the secondary jet nozzle 2 in the solder tank 6 is dropped. The guide plates 4, 5 are formed in a V-shape with solder guide portions 4a, 5a to be described later(see FIGS. 2 and 3) so that the molten solder S is dropped at different positions on the solder face F in the solder tank 6.

Jet openings 1a, 2a are incurvated and are provided at two places where the jet waves 24, 25 formed by the jet nozzles 1, 2 provided in the solder tank 6 and a circuit board P transported in the direction of arrow A with a conveyer (not shown) meet each other. The bottom ends of the incurvation are placed above the molten solder S. Jet opening 2b is bent upward so as to refrain the molten solder flowed by the jet opening 2b from flowing over the molten solder S. The molten solder S reservoired in the solder tank 6 is flowed with the pump (not shown) so as to form the jet waves 24, 25. The circuit board P is transported to the jet waves 24, 25 and soldered by being in contact to the jet waves 24, 25.

Figure 2:
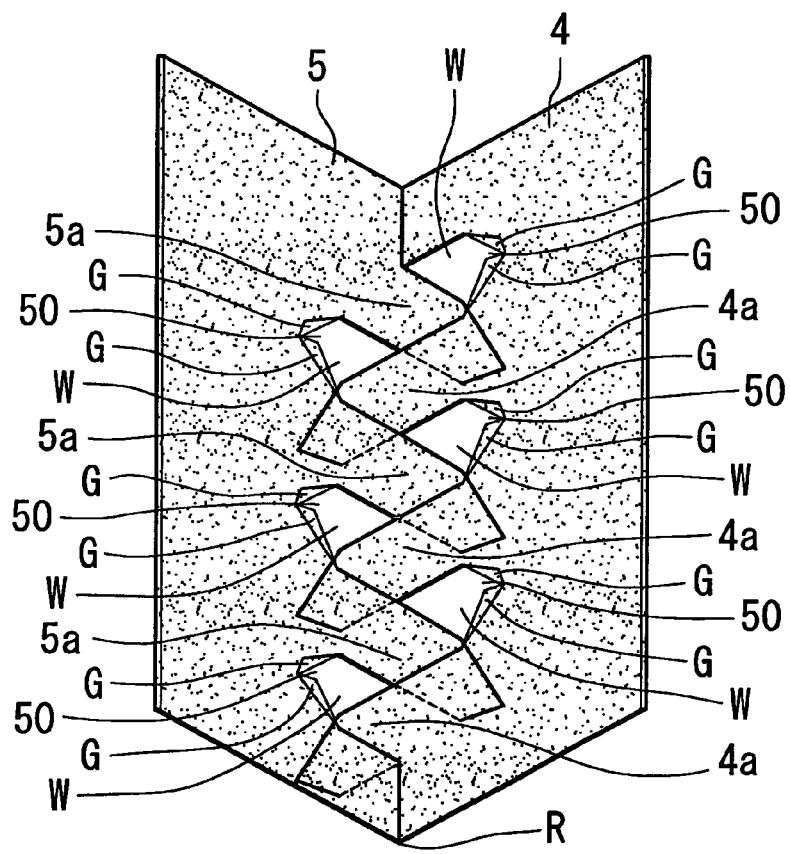
FIG. 2 is a perspective view of a guide plate according to the present invention.
Figure 3A:
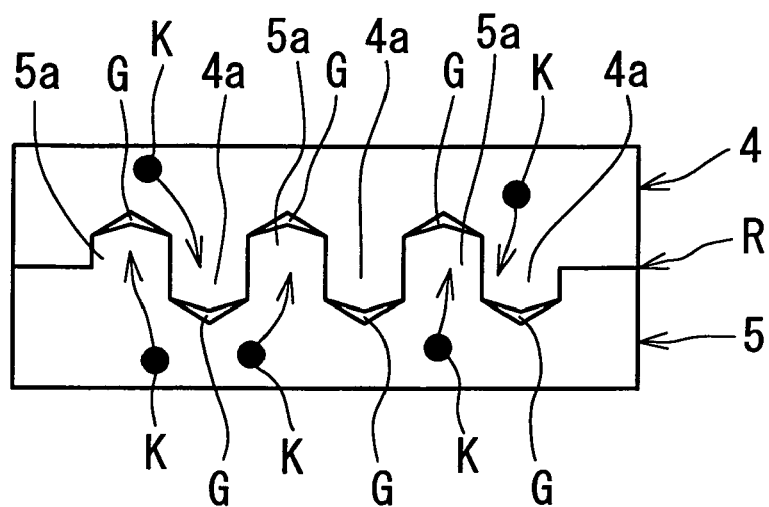
FIG. 3 is a plan view (a), a front view (b) and a side view (c) of the guide plate according to the present invention.
Figure 3B:
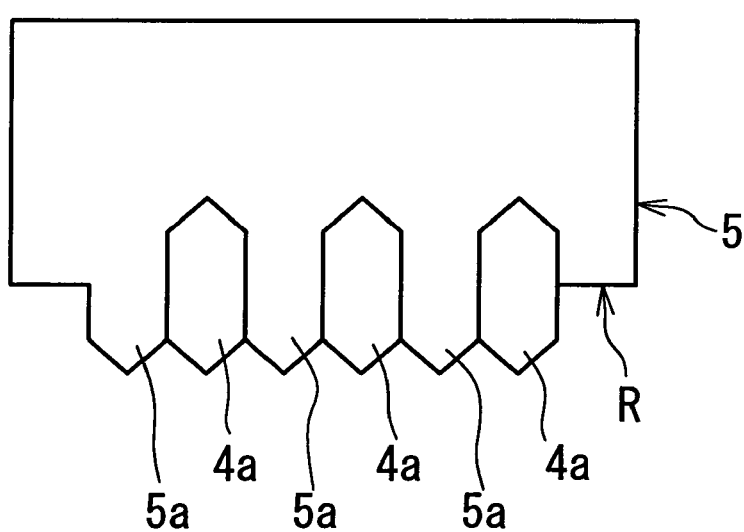
Figure 3C:
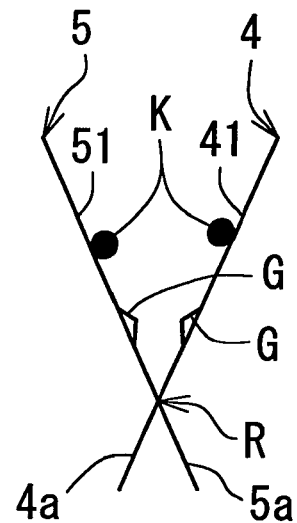

The structure of the guide plates 4, 5 is explained with reference to FIGS. 2, 3 and 4. As shown in FIG. 4, the guide plates 4, 5 are formed in a manner that a flat plate 10, which is a piece of a material having anti-stick quality to solder, for example, stainless steel, is punched through, and the flat plate 10 is bent into a V-shape at an approximate center portion R. As shown in FIG. 2, the guide plates 4, 5 each has the stripe-shaped solder guide portions 4a, 5a so as to make the molten solder S dropped at different positions on the solder face F in the solder tank 6. The solder guide portions 4a, 5a are bent into the V-shape at the approximate center portion R so as to make the solder guide portions 4a, 5a cross each other. Portions where the solder guide portions 4a, 5a cross thus have spaces W. The molten solder which is dropped along the solder guide portions 4a, 5a passes through the spaces W and is dropped on the solder face F which is opposite side of the guide plate where the molten solder is dropped. That is, the molten solder is dropped on the nozzle side different to the nozzle side where the solder is flowed. Although FIG. 1 shows that the solder guide portions 4a, 5a are placed above the solder face F, it is possible to have another configurations as long as the center portion R is placed above the solder face F. However, it is preferable if the solder guide portions 4a, 5a are placed above the solder face F.

The angle of the V-shape, the position and the size of the solder guide portions 4a, 5a should be properly determined in consideration of viscosity of the molten solder, the transport speed of the circuit board P, etc., so that the molten solder in the solder tank flowed from the primary jet nozzle and the secondary jet nozzle does not merge each other when dropping thereby optimally preventing the accumulation of the dross.

The solder guide portions 4a, 5a have a solder separator G therebetween so as to separate the molten solder flowed from the jet openings. The solder separator G is made to stand at a cutting portion 50 by bending in the direction that the molten solder is dropped. It does not matter which sides of the jet nozzles 1, 2 the guide plates 4, 5 are placed to, but, for making understanding easier, as shown in FIG. 1, the guide plate 5 and the guide plate 4 are placed to the primary jet nozzle 1 and the secondary jet nozzle 2, respectively.

The function of the guide plates 4, 5 is explained hereinafter according to FIG. 3. The molten solder K is dropped onto upper portions 41, 51 of the guide plates 4, 5 provided at a position where the molten solder K in the solder tank flowed from the primary jet nozzle 1 and the secondary jet nozzle 2 is dropped. The molten solder K flowing from the primary jet nozzle 1 is dropped on the guide plate 5. The space W is formed at a point where the solder guide portions 4a, 5a cross. Among the molten solder K dropped on the guide plate 5, the molten solder K dropped at a position where the solder guide portion 5a is formed is passed through the space W and dropped along the solder guide portion 5a. The molten solder K is then dropped to the solder face F on the side where the secondary jet nozzle 2 in the solder tank 6 is placed. Also, among the molten solder K dropped on the guide plate 5, the molten solder K dropped onto a position where the solder separator G is formed is separated with the solder separator G and dropped along the solder guide portion 5a provided at both sides. The molten solder K is then dropped on the solder face F at a proximal position where the secondary jet nozzle 2 is placed in the solder tank 6.

In the same manner, the molten solder K flowing from the secondary jet nozzle 2 is dropped on the guide plate 4. Among the molten solder K dropped on the guide plate 4, the molten solder K dropped at a position where the solder guide portion 4a is formed is made to drop along the solder guide portion 4a and passed through the space W. The molten solder K is then dropped to the solder face F on the side where the primary jet nozzle 1 is placed in the solder tank 6. Also, among the molten solder K dropped on the guide plate 4, the molten solder K dropped onto a position where the solder separator G is formed is separated with the solder separator G and dropped along the solder guide portion 4a provided at both sides. The molten solder K is then dropped on the solder face F at a proximal position where the primary jet nozzle 1 is placed in the solder tank 6.

Figure 5:
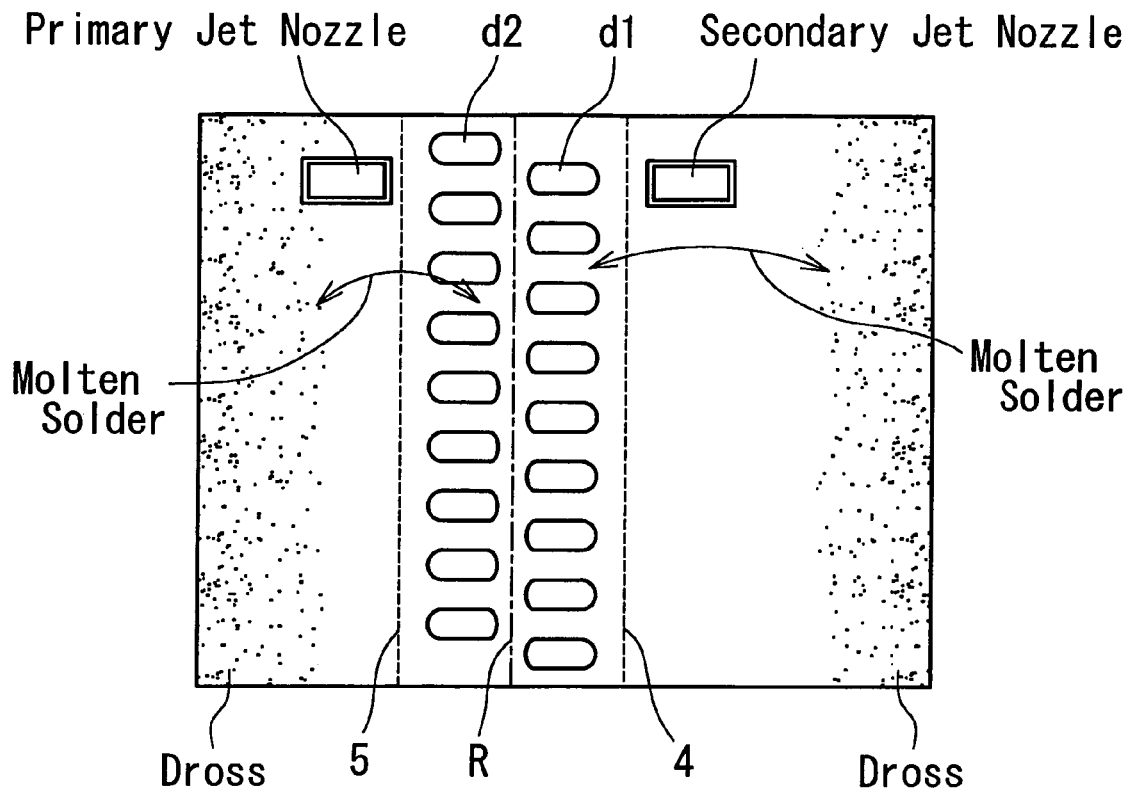
FIG. 5 is an explanatory drawing illustrating a condition that molten solder is dropped in the flow soldering apparatus according to the present invention.

That is, the guide plates 4, 5 function in such a manner that the molten solder K flowed from the primary jet nozzle 1 and the molten solder K flowed from the secondary jet nozzle 2 is dropped at different sides on which the molten solder was flowed. Because the guide plates 4, 5 are formed in that each of the solder guide portions 4a, 5a is alternately configured in the direction of the ridge line R formed by bending the plate into the V-shape, the molten solder K flowed from the same nozzle is also dropped at different positions on the solder face F in the solder tank 6. Specifically, the molten solder K is dropped at positions, which are separated by width of the solder guide portion 4a or the solder guide portion 5a. Accordingly, as shown in FIG. 5, the molten solder K flowed and dropped from the primary jet nozzle 1 and the secondary jet nozzle 2 in the solder tank does not merge each other. Further, the molten solder dropped at either position d1 or d2, which are separated by width of either the solder guide portion 4a or the solder guide portion 5a, interact each other prohibiting the dross built up between the primary jet nozzle and the secondary jet nozzle. In FIG. 5, the guide plates 4, 5 are shown in broken-lines; details thereof are omitted.

Next, the flow soldering apparatus provided with the above-described guide plates 4, 5 will be explained with reference to FIG. 1 and FIG. 5. First, the circuit board P is conveyed over the primary jet nozzle 1 in the direction of arrow A with the conveyer (not shown). The circuit board P first contacts to the jet wave 24 formed by the primary jet nozzle 1 and then contacts to the jet wave 25 formed by the secondary jet nozzle 2. The circuit board P further proceeds and is detached from the flow soldering apparatus. In the molten solder flowed from the primary jet nozzle 1 and the secondary jet nozzle 2, after the circuit board P is made contact with the jet waves 24, 25, the excess of the molten solder is dropped onto upper portions of the guide plates 4, 5.

As aforementioned, the molten solder K, which is flowed from the primary jet nozzle 1 and the secondary jet nozzle 2 and dropped onto the upper portions of the guide plates 4, 5, is made to drop on the nozzle side different to the nozzle side where the solder is flowed as shown in FIG. 1. Furthermore, since the guide plates 4, 5 are formed in that each of the solder guide portions 4a, 5a is alternately configured in the direction of the ridge line formed by bending the plate into the V-shape, the molten solder K flowed from the same nozzle is also dropped at different positions on the solder face F in the solder tank 6. That is, the molten solder K is dropped at the positions d1 and d2, which are separated by width of either the solder guide portion 4a or the solder guide portion 5a. As shown in FIG. 5, the molten solder K flowed and dropped from the primary jet nozzle 1 and the secondary jet nozzle 2 in the solder tank does not thus merge each other. Further, the molten solder dropped at either position d1 or d2, which is separated by width of either the solder guide portion 4a or the solder guide portion 5a, interact each other prohibiting the accumulation of the dross between the primary jet nozzle and the secondary jet nozzle.

In case the angle of the V-shape in the guide plates 4, 5 is made to be small, the distance between the molten solder K flowed and dropped from the primary jet nozzle and the secondary jet nozzle becomes narrow, whereas the distance therebetween becomes wide when the angle gets large. Accordingly, in consideration of the distance between the primary jet nozzle and the secondary set nozzle and the cooldown of the solder attached to the substrate, the angle of the V-shape should be wider as much as possible so as to prohibit the merging of the molten solder K and the accumulation of the dross between the primary jet nozzle and the secondary jet nozzle. However, in case the angle of the V-shape is made to be wide, a dropping speed of the molten solder becomes lowered, so that not only the molten solder is prohibited from smoothly dropping along the guide plates 4, 5, but also the molten solder cools down until falling into the solder tank 6 thereby unfavorably making the temperature of the molten solder in the solder tank 6 lowered. On the other hand, in case the angle is made to narrow, the distance between the molten solder dropped into the solder tank 6 becomes short, which advances the accumulation of the dross between the primary jet nozzle and the secondary jet nozzle due to the merging of molten solder K dropped. The angle of the V-shape should be thus properly determined based on not only the position and the size of the solder guide portions 4a, 5a but also the viscosity of the molten solder, the conveying speed of the circuit board P, etc. Because the guide plates are formed into the V-shape as discussed above, the angle of the V-shape can be easily adjusted according to properties that the solder tank owns, for example, the distance between the primary jet nozzle and the secondary jet nozzle.

Figure 6:
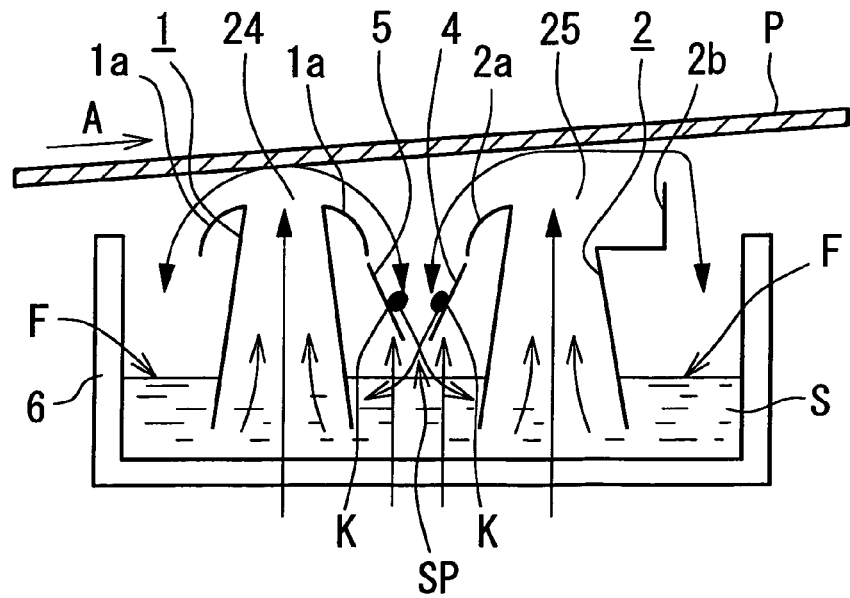
FIG. 6 is a drawing illustrating another embodiment of the flow soldering apparatus according to the present invention.
Figure 7:
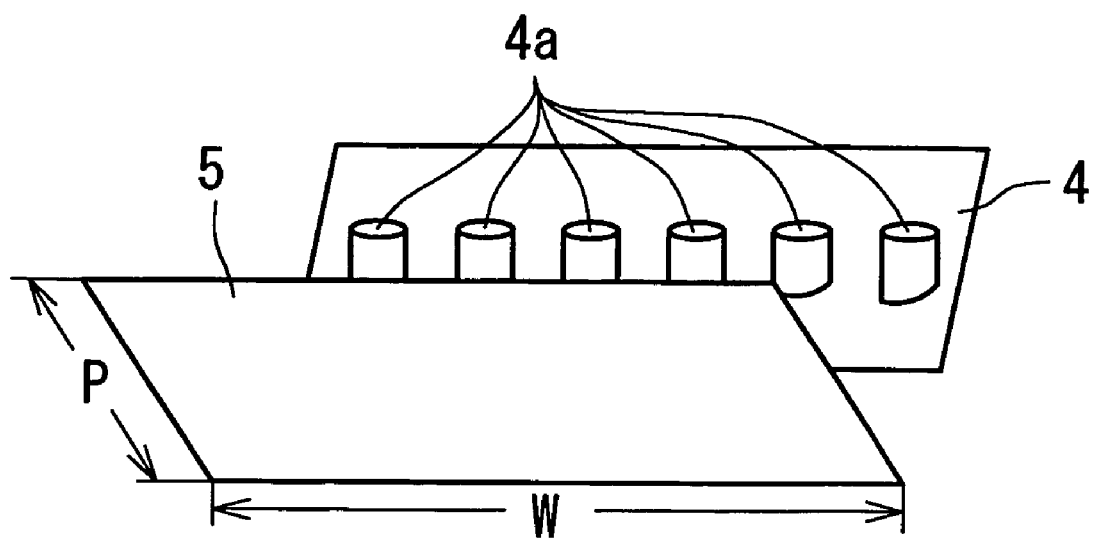
FIG. 7 is a perspective view illustrating another embodiment of the guide plate according to the present invention.
Figure 8A:
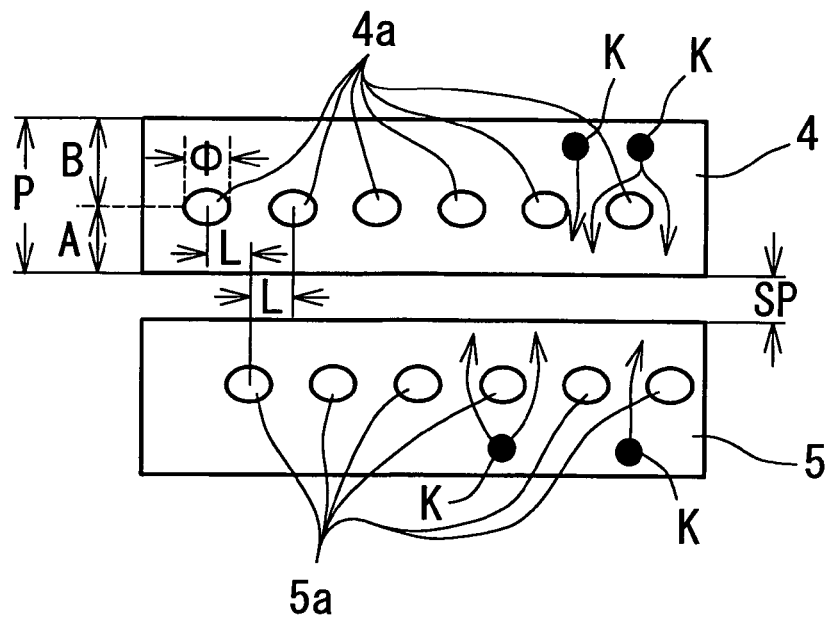
FIG. 8 is a plan view (a), a front view (b) and a side view (c) of the guide plate based on FIG. 7.
Figure 8B:
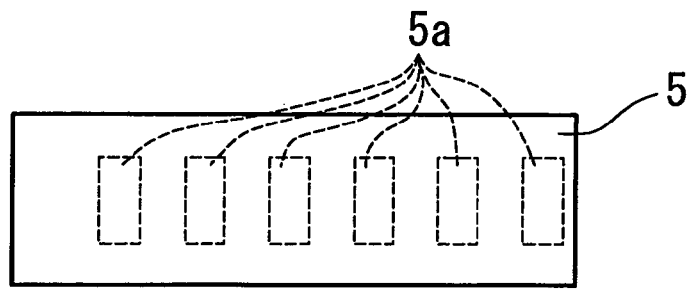
Figure 8C:
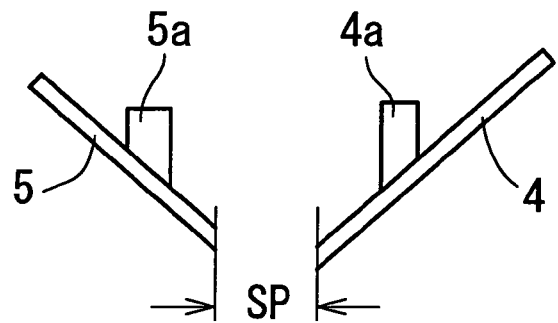
Figure 9:
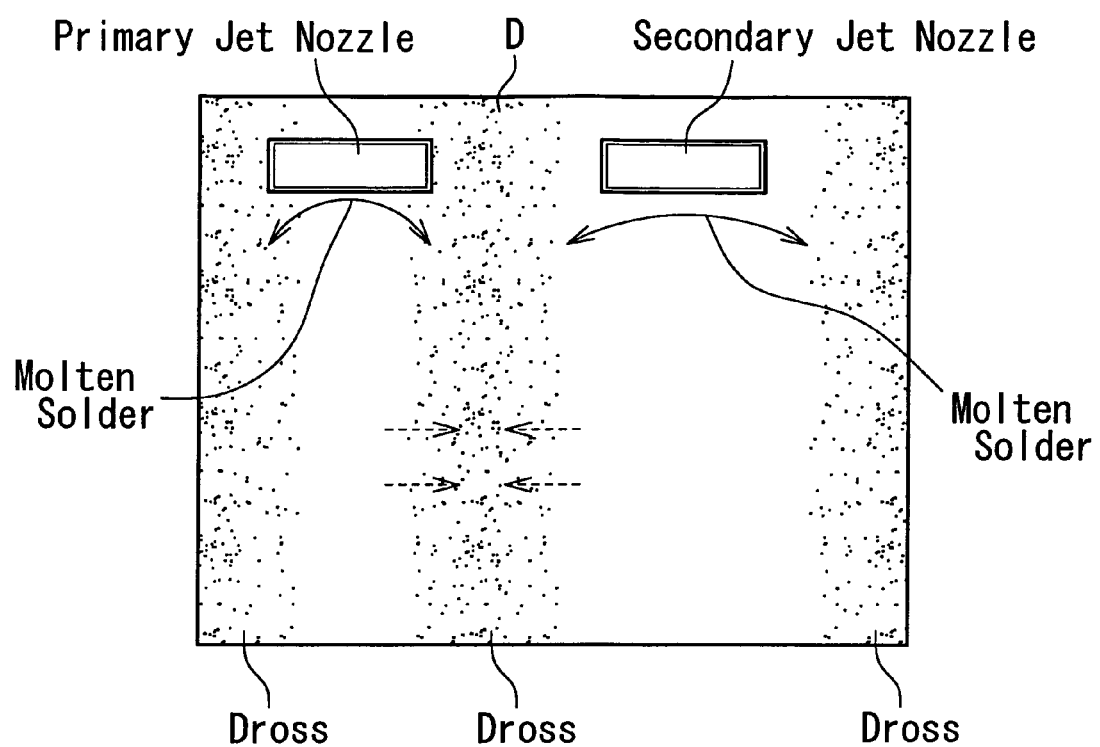
FIG. 9 is an explanatory drawing illustrating a condition that molten solder is dropped in a conventional flow soldering apparatus.

Another embodiment of guide plates 4, 5 in a flow soldering apparatus according to the present invention will be explained with reference to FIG. 6. FIG. 6 shows the embodiment of the guide plates 4, 5 in which two pieces of individual plates are placed into a V-shape as shown in FIG. 7 and FIG. 8. In FIG. 6, a solder tank 6 reservoiring molten solder S comprises a primary jet nozzle 1, a secondary nozzle 2 and a pump (not shown) forming jet waves 24, 25. Between the primary jet nozzle 1 and the secondary jet nozzle 2, the guide plates 4, 5 are placed above a solder face F of the molten solder S. The guide plates 4, 5 are placed at where molten solder K in the solder tank 6 flowed from the primary jet nozzle and the secondary jet nozzle is dropped. The guide plates 4, 5 are formed by placing two pieces of the plates into the V-shape while a space SP is provided along a ridge line of the guide plates 4, 5 in the V-shape. Here, solder guide portions 4a, 5a hereinafter explained are omitted from FIG. 6.

As shown in FIGS. 7 and 8, bottom ends of the guide plates 4, 5 have the space SP whereby the molten solder K dropped on the guide plates 4, 5 falls on the nozzle side different to the nozzle side where the solder is flowed. There are provided some cylindrical solder guide portions 4a, 5a standing on the guide plates 4, 5 in the direction of the ridge line of the space SP. Each of the solder guide portions 4a, 5a is provided on a position where the molten solder K is made to drop at different positions on the solder face F in the solder tank 6. Specifically, each of the solder guide portions 4a has a distance 2L therebetween while each of the solder guide portions 5a has a distance 2L therebetween, and the solder guide portions 4a, 5a stand on the V-shaped guide plates 4, 5, which is perpendicular to the solder face F. Further, the distance between the solder guide portion 4a and the solder guide portion 5a has a distance L, and each of the solder guide portions 4a, 5a is provided alongside and alternately. Still further, the shape of the solder guide portions 4a, 5a is not limited to the cylindrical bar but may be a triangle bar, polygonal bar such as square bar, etc. or an elliptic bar.

The angle of the V-shape, the position and the size of the solder guide portions 4a, 5a, and the space SP should be suitably determined in consideration of viscosity of the molten solder K, a transport speed of the circuit board P, etc., so that the molten solder K in the solder tank flowed from the primary jet nozzle and the secondary jet nozzle does not merge each other when being dropped thereby optimally preventing the accumulation of the dross between the jet nozzles. For example, in case each of the guide plates 4, 5 has 250-350 mm in width W, a diameter $\Phi$ and a height of the cylindrical solder guide portions 4a, 5a are 5-10 mm and 10-20 mm respectively, and the distance L between the solder guide portion 4a and the solder guide portion 5a is 25 mm. The position where the solder guide portions 4a, 5a are provided is calculated as that central portions of the solder guide portions 4a, 5a are placed over approximately A/B=½ to the length P of the guide plates 4,5. The numbers of the solder guide portions 4a, 5a are around 10-20. The space SP between the guide plates 4, 5 should be properly determined in consideration of the length P, slope, etc. of the guide plates 4, 5, whereby the molten solder flowed from the primary jet nozzle and the secondary jet nozzle falls on the nozzle side different to the nozzle side where the solder is flowed.

The guide plates 4, 5 serve as follows. The guide plates 4, 5 can be provided at any sides of the jet nozzles 1, 2, but, for making understanding easier, as shown in FIG. 6, the guide plate 5 and the guide plate 4 are assumed to be provided at the primary jet nozzle 1 and the secondary nozzle 2, respectively. That is, the molten solder K is dropped on upper portions of the guide plates 4, 5 provided at a position where the molten solder K in the solder tank flowed from the primary jet nozzle 1 and the secondary jet nozzle 2 is dropped. The molten solder K flowing from the primary jet nozzle 1 is dropped on the guide plate 5. Among the molten solder K dropped on the guide plate 5, the molten solder K dropped at a position where the solder guide portion 5a is not formed is passed through between the solder guide portions 5a. The molten solder K is then dropped to the solder face F on the side where the secondary jet nozzle 2 in the solder tank 6 is placed. Also, among the molten solder K dropped on the guide plate 5, the molten solder K dropped on a position where the solder guide portion 5a is provided is separated with the solder guide portion 5a and dropped on the solder face F on the side where the secondary jet nozzle 2 in the solder tank 6 is placed.

In the same manner as above, the molten solder K flowing from the secondary jet nozzle 2 is dropped on the guide plate 5. Among the molten solder K dropped on the guide plate 5, the molten solder K dropped at a position where the solder guide portion 5a is not formed is dropped between the solder guide portions 5a. The molten solder K is then dropped to the solder face F on the side where the secondary jet nozzle 2 in the solder tank 6 is placed. Also, among the molten solder dropped on the guide plate 5, the molten solder K dropped on a position where the solder guide portion 5a is provided is separated with the solder guide portion 5a and dropped on the solder face F on the side where the primary jet nozzle 1 in the solder tank 6 is placed.

That is, the guide plates 4, 5 function in such a manner that the molten solder flowed from the primary jet nozzle 1 and the molten solder jetted from the secondary jet nozzle 2 drop at different sides on which the molten solder was flowed. Because the guide plates 4, 5 are formed in that each of the solder guide portions 4a, 5a is alternately configured in the direction of a ridge line formed by placing two pieces of plates into a V-shape, the molten solder K flowed from the same nozzle is also dropped at different positions on the solder face F in the solder tank 6. Specifically, the molten solder K is dropped at positions separated by width L of either the solder guide portion 4a or the solder guide portion 5a. Accordingly, as shown in FIG. 5, the molten solder K flowed and dropped from the primary jet nozzle 1 and the secondary jet nozzle 2 in the solder tank does not merge each other thereby prohibiting the accumulation of the dross between the primary jet nozzle and the secondary jet nozzle.

Next, the flow soldering apparatus provided with the above-described guide plates 4, 5 will be explained with reference to FIG. 5 and FIG. 6. First, the circuit board P is conveyed over the primary jet nozzle 1 in the direction of arrow A with the conveyer (not shown). The circuit board P first contacts to the jet wave 24 formed by the primary jet nozzle 1 and then contacts to the jet wave 25 formed by the secondary jet nozzle 2. The circuit board P further proceeds and is detached from the flow soldering apparatus. In the molten solder flowed from the primary jet nozzle 1 and the secondary jet nozzle 2, after the circuit board P was made contact with the jet waves 24, 25, the excess of the molten solder is dropped onto upper portions of the guide plates 4, 5.

As described above, the molten solder K dropped onto the upper portions of the guide plates 4, 5 drops on the nozzle side different to the nozzle side where the solder is flowed as shown in FIG. 6. Furthermore, since the guide plates 4, 5 are formed in that each of the solder guide portions 4a, 5a is alternately configured in the direction of the ridge line formed by placing two pieces of plates into a V-shape, the molten solder K flowed from the same nozzle is also dropped at different positions on the solder face F in the solder tank 6. That is, the molten solder K is dropped at position d1 or d2 separated by width of either the solder guide portion 4a or the solder guide portion 5a. As shown in FIG. 5, the molten solder flowed and dropped from the primary jet nozzle 1 and the secondary jet nozzle 2 in the solder tank does not thus merge each other. Further, the molten solder dropped at either position d1 or d2, which is separated by width of either the solder guide portion 4a or the solder guide portion 5a, interact each other prohibiting the accumulation of the dross between the primary jet nozzle and the secondary jet nozzle.

INDUSTRIAL APPLICABILITY

In a flow soldering apparatus according to claim 1, at a position where molten solder flowed from a primary jet nozzle and a secondary jet nozzle in a solder tank is dropped, a V-shaped guide plate provided with solder guide portions is placed, so that the molten solder flowed from the primary jet nozzle and the secondary jet nozzle drops on a nozzle side different to the nozzle side where the solder is flowed. Accordingly, an interval between the primary jet nozzle and the secondary jet nozzle can be shortened, whereby the solder does not cool down while the circuit board moves between the primary jet nozzle and the secondary jet nozzle, preventing occurrence of soldering failure, bridges, icicles, etc. and thus maintaining soldering performance. Because the interval between the jet nozzles can be shortened, miniaturization of the flow soldering apparatus is possible. Since the solder does not cool down, lead-free solder is applicable, thus considerably contributing to environmental protection.

In a flow soldering apparatus recited in claim 2, the guide plate is made of a material to which the solder is not attached, whereby not only maintenance of the guide plate such as cleaning, exchanging, etc. is not required, but also the molten solder is made to drop smoothly, which can maintain temperature of the molten solder in a solder tank, thus reducing an energy consumption.

In a flow soldering apparatus of claim 3, because the guide plate is formed only with stripe-shaped solder guide portions alternately configured in the direction of a ridge line of a plate bended into a V-shape, the structure of the guide plate is simplified.

In a flow soldering apparatus of claim 4, a solder separator is provided between the stripe-shaped solder guide portions formed on the guide plate, thus the molten solder dropped on upper portions placed between the solder guide portions passes through between the solder guide portions, which prevents the molten solder from dropping on the nozzle side same to the nozzle side where the solder is flowed. Accordingly, the molten solder in the solder tank flowed from the primary jet nozzle and the secondary jet nozzle does not merge each other when dropping thereby effectively preventing the accumulation of the dross between the primary jet nozzle and the secondary jet nozzle.

In a flow soldering apparatus of claim 5, the guide plate, which is formed by placing two pieces of plates into a V-shape, has a space along a ridge line of the V-shaped guide plate, whereby position and speed at which the molten solder is dropped can be optionally determined. As a result, position of the primary jet nozzle and the secondary jet nozzle in the solder tank can be more freely determined.

In a flow soldering apparatus of claim 6, because the guide plate is formed in such a manner that some of the independent solder guide portions are alternately provided in the direction of the ridge line, the molten solder dropped from the same jet nozzle is made to fall onto the position apart by the width of the solder guide portion, whereby the molten solder interacts each other to effectively prevent the accumulation of the dross.

In a flow soldering apparatus of claim 7, because an intersection point or an extended intersection point of the V-shaped guide plate is placed above the molten solder, the molten solder dropped on the upper portion placed between the solder guide portions passes through between the solder guide portions thereby preventing the molten solder from dropping on the nozzle side same to the nozzle side where the solder is flowed. Accordingly, the molten solder in the solder tank flowed from the primary jet nozzle and the secondary jet nozzle does not merge each other when being dropped thereby effectively preventing the accumulation of the dross.

The invention claimed is:

1. A flow soldering apparatus which comprises a V-shaped guide plate provided with solder guide portions at a position where molten solder flowed from a primary jet nozzle and a secondary jet nozzle in a solder tank is dropped so as to make the molten solder flowed from the primary jet nozzle and the secondary jet nozzle drop onto a nozzle side different to a nozzle side where the solder is flowed, wherein an intersection point or an extended intersection point of the V-shaped guide plate is placed above the molten solder.

2. A flow soldering apparatus according to claim 1, wherein the guide plate is made of a material to which the solder is not attached.

3. A flow soldering apparatus according to claim 1, wherein the guide plate is provided with stripe-shaped solder guide portions alternately configured in the direction of a ridge line of a single plate bent into a V-shape.

4. A flow soldering apparatus according to claim 3, wherein a solder separator is provided between the stripe-shaped solder guide portions formed on the guide plate.

5. A flow soldering apparatus according to claim 1, wherein the guide plate is formed by placing two pieces of plates into a V-shape and has a space along a ridge line thereof.

6. A flow soldering apparatus according to claim 5, wherein the guide plate is formed in that some of the independent solder guide portions are alternately provided in the direction of the ridge line.

7. A flow soldering apparatus according to claim 2, wherein the guide plate is provided with stripe-shaped solder guide portions alternately configured in the direction of a ridge line of a single plate bent into a V-shape.

8. A flow soldering apparatus according to claim 2, wherein the guide plate is formed by placing two pieces of plates into a V-shape and has a space along a ridge line thereof.

9. A flow soldering apparatus according to claim 2, wherein an intersection point or an extended intersection point of the V-shaped guide plate is placed above the molten solder.

10. A flow soldering apparatus according to claim 3, wherein an intersection point or an extended intersection point of the V-shaped guide plate is placed above the molten solder.

11. A flow soldering apparatus according to claim 4, wherein an intersection point or an extended intersection point of the V-shaped guide plate is placed above the molten solder.

12. A flow soldering apparatus according to claim 5, wherein an intersection point or an extended intersection point of the V-shaped guide plate is placed above the molten solder.

13. A flow soldering apparatus according to claim 6, wherein an intersection point or an extended intersection point of the V-shaped guide plate is placed above the molten solder.

* * * * *